United States Patent [19]
Kim

[11] Patent Number: 5,530,294
[45] Date of Patent: Jun. 25, 1996

[54] SEMICONDUCTOR CONTACT THAT PARTIALLY OVERLAPS A CONDUCTIVE LINE PATTERN AND A METHOD OF MANUFACTURING SAME

[75] Inventor: Jae K. Kim, Kyoungki-do, Rep. of Korea

[73] Assignee: Hyundai Electronics Industries Co., Ltd., Kyoungki-do, Rep. of Korea

[21] Appl. No.: 421,793

[22] Filed: Apr. 14, 1995

Related U.S. Application Data

[62] Division of Ser. No. 159,551, Dec. 1, 1993, Pat. No. 5,427,980.

[30] Foreign Application Priority Data

Dec. 2, 1992 [KR] Rep. of Korea ............... 92-23045

[51] Int. Cl.⁶ .................. H01L 23/48; H01L 23/52; H01L 29/40
[52] U.S. Cl. ............... 257/774; 257/635; 257/758
[58] Field of Search ................ 257/754, 755, 257/756, 758, 382, 635, 774

[56] References Cited

U.S. PATENT DOCUMENTS

| | | |
|---|---|---|
| 4,102,733 | 7/1978 | De La Moneda et al. ......... 156/653 |
| 4,833,519 | 5/1989 | Kawano et al. . |
| 5,094,980 | 3/1992 | Shepela ......................... 437/189 |
| 5,177,592 | 1/1993 | Takahashi et al. ............... 257/758 |
| 5,182,627 | 1/1993 | Chen et al. ..................... 257/49 |
| 5,184,205 | 2/1993 | Shibata ......................... 257/765 |
| 5,202,579 | 4/1993 | Fujii et al. .................... 257/751 |
| 5,293,512 | 3/1994 | Nishigoori et al. .............. 257/622 |

*Primary Examiner*—Ngân V. Ngô
*Attorney, Agent, or Firm*—Popham, Haik, Schnobrich & Kaufman, Ltd.

[57] ABSTRACT

A contact of a semiconductor device has an interlayer-insulating film sandwiched between upper and lower conductive line patterns, a conductive pad for electrically connecting the upper and lower conductive line patterns via a contact hole formed in the interlayer-insulating film to expose the lower conductive line pattern to the upper conductive line pattern, and a barrier material pattern formed on the upper conductive line pattern and conductive pad to partially overlap the conductive pad with the upper conductive line pattern, so that the lower and upper conductive line patterns on both sides of the interlayer-insulating film partially overlap with each other without damaging the lower conductive line pattern, thereby improving packing density of the semiconductor device. Also, a manufacturing method of the contact is provided.

13 Claims, 4 Drawing Sheets

SEMICONDUCTOR CONTACT THAT PARTIALLY OVERLAPS A CONDUCTIVE LINE PATTERN AND A METHOD OF MANUFACTURING SAME

This is a divisional U.S. patent application Ser. No. 08/159,551, filed Dec. 1, 1993, now U.S. Pat. No. 5,427,980.

BACKGROUND OF THE INVENTION

1. Field of the Invention

The present invention relates to a contact in a multilayered structure of a highly-integrated semiconductor device for electrically connecting conductive lines arranged on the upper and lower portions of an interlayer-insulating film, and more particularly to a contact of a semiconductor device, which partially overlaps an upper conductive line for increasing packing density of the semiconductor device, and a method for manufacturing the same.

2. Description of the Prior Art

In the multilayered structure of semiconductor devices, a conventional contact for electrically connecting upper and lower conductive line patterns arranged on the upper and lower portions of an interlayer-insulating film is designed to completely overlap the upper conductive line pattern. Also, in order to fully overlap the contact, the upper conductive line pattern must be wider than the lower conductive line pattern. Making the upper conductive line pattern wider than the lower conductive line pattern increases the unit area of circuit devices included in the semiconductor device and result in decreasing packing density of the semiconductor device. The complete overlapping of the contact with the upper conductive line pattern is caused by its manufacturing process of stacking an interlayer-insulating film having a contact hole in the lower conductive line pattern, forming a conductive layer on the interlayer-insulating film and in the contact hole, and forming the contact and upper conductive line pattern by patterning the conductive layer. Moreover, the width of the upper conductive line pattern is further increased due to linewidth deviation and misalignment margin of a mask, which occur during formation of the conventional contact.

FIG. 1 illustrates a layout of a semiconductor device having a bitline pattern 10 overlapping a contact 12. The portion of the bitline pattern 10 overlapping the contact 12 is wider than an impurity diffusion region 14 formed on the lower portion of the semiconductor device. Because the width of the bitline pattern 10 is greater than the area of the impurity diffusion region 14 which serves as a lower conductive line pattern, the packing density of the semiconductor device is restricted.

Furthermore, the method for forming the contact of the conventional semiconductor device is disadvantageous in that, when the contact 12 is intended to partially overlap the bitline pattern 10 on the upper portion thereof, the impurity diffusion region 14 (the lower conductive line pattern) is damaged.

SUMMARY OF THE INVENTION

Therefore, it is an object of the present invention to provide a contact of a semiconductor device that partially overlaps a conductive line pattern formed on the upper portion of an interlayer-insulating film without damaging a conductive line pattern disposed on the lower portion of the interlayer-insulating film, and a manufacturing method for the contact.

To achieve the above object of the present invention, a contact of a semiconductor device includes a semiconductor substrate having a first conductive line pattern thereon. An interlayer-insulating film of the semiconductor device is stacked on the surface of the semiconductor substrate to form a contact hole for exposing the first conductive line pattern, and a conductive pad is formed on the contact hole. A barrier material pattern is formed on the upper portion of the conductive pad to partially expose a portion of the conductive pad. Also, a second conductive line pattern is formed to partially overlap the exposed conductive pad and the barrier material pattern.

To achieve the above object of the present invention, a method for manufacturing a contact of a semiconductor device has the steps of providing a semiconductor substrate having a first conductive line pattern thereon, forming an interlayer-insulating film on the surface of the semiconductor substrate having the first conductive line pattern thereon, forming a contact hole in the interlayer-insulating film to expose the first conductive line pattern, forming a conductive pattern on the contact hole, forming a barrier material pattern on the upper portion of the conductive pad to expose a portion of the conductive pad, and forming a second conductive line pattern for partially overlapping the exposed conductive pad and barrier material pattern.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

Figure 1:
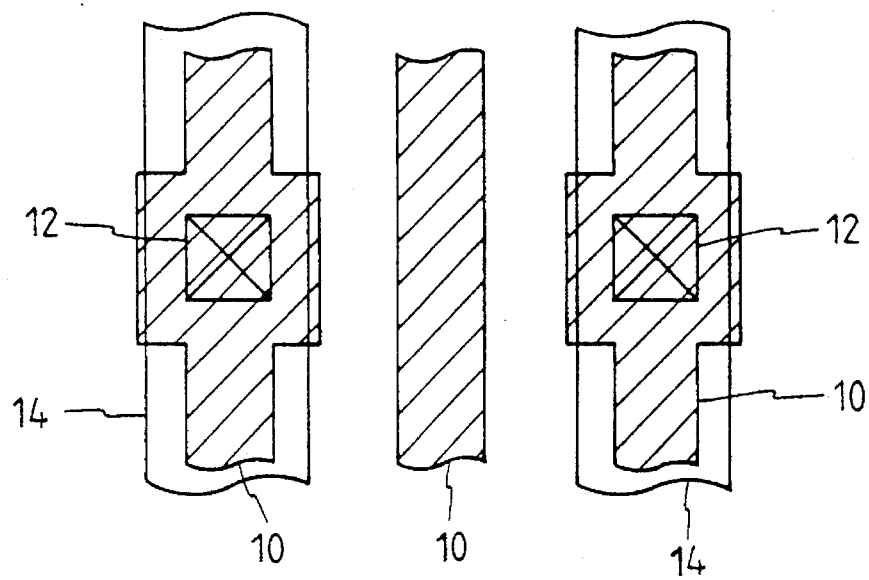
FIG. 1 shows a layout of a conventional semiconductor device having a bitline pattern overlapping a contact.
Figure 2:
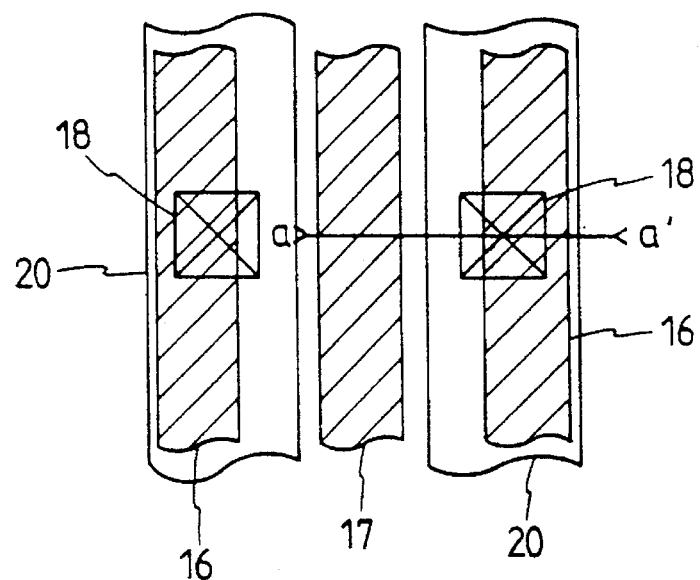
FIG. 2 shows a layout of a semiconductor device having a bitline pattern overlapping a contact according to the present invention.

Referring to FIG. 2, a semiconductor device has a bitline pattern 16 partially overlapping a contact 18, and a bitline pattern 17 that does not overlap contact 18. The bitline pattern 16 is narrower than an impurity diffusion region 20 formed on the lower portion of bitline pattern 16 and thoroughly overlaps the impurity diffusion region 20. While the contact 18 partially overlaps the bitline pattern 16, it fully overlaps the impurity diffusion region 20. By the partial overlapping of the contact 18 with the bitline pattern 16, the bitline pattern 16 is narrower than the impurity diffusion region 20, and the unit area of circuit elements included in the semiconductor device can be minimized.

Figure 3A:
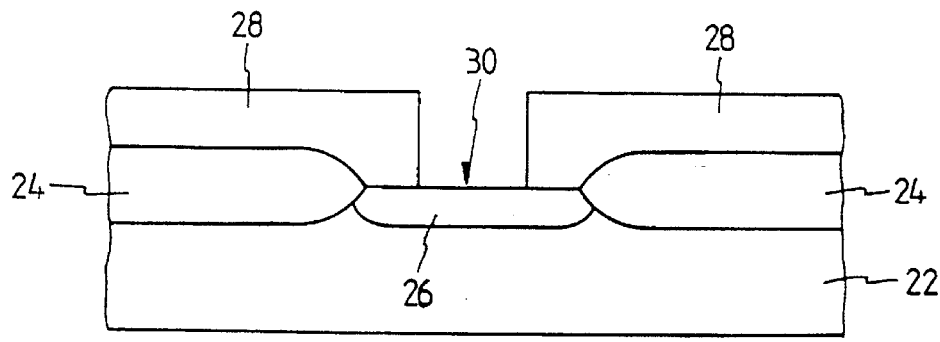
FIGS. 3A to 3C are sectional views showing a process for forming the contact of the conventional semiconductor device.
Figure 3B:
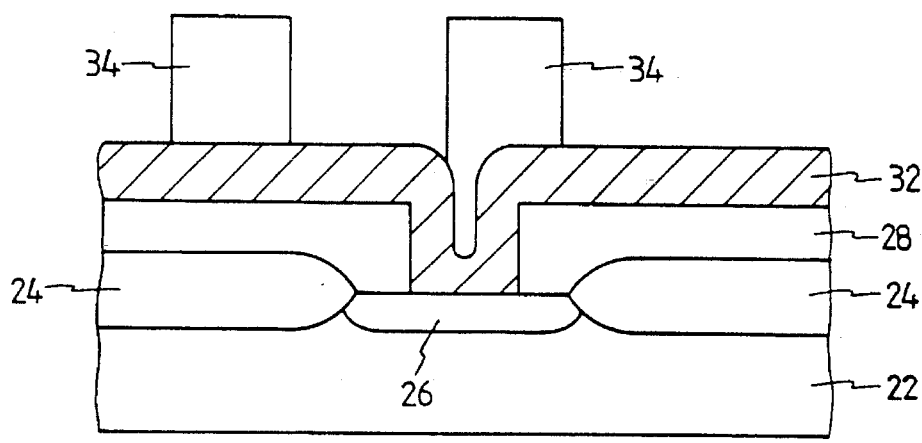
Figure 3C:
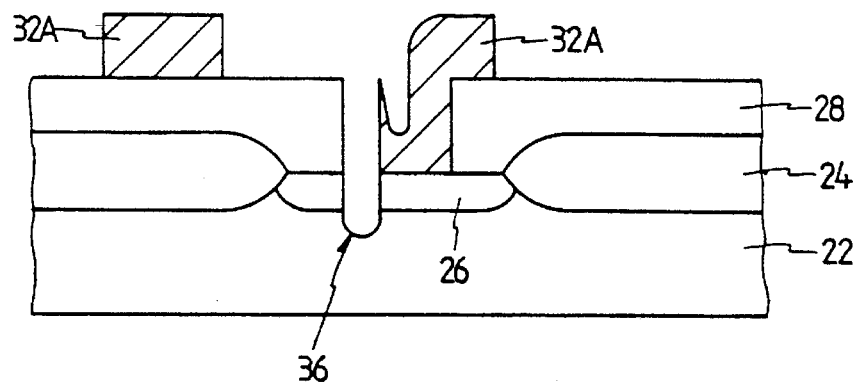

FIGS. 3A to 3C are sectional views showing the semiconductor device, taken along line a—a' shown in FIG. 2, which illustrate a process for forming the contact partially overlapping the bitline pattern according to a method for forming the contact of the conventional semiconductor device.

Referring to FIG. 3A, a semiconductor device 22 has an isolation layer 24 formed for separating regions on which respective elements will be formed, and an impurity diffusion layer 26 formed on the region having its corresponding element thereon. The impurity diffusion region 26 is an electrode pattern as a source or drain region, which will be electrically connected to the bitline pattern 16 shown in FIG. 2. An interlayer-insulating film 28 having a contact hole 30 formed therein is stacked on the upper portion of the semiconductor substrate 22 having the isolation layer 24 and impurity diffusion layer 26. The contact hole 30 is formed by removing an interlayer-insulating material provided on the upper portion of the impurity diffusion layer 26 in the interlayer-insulating material stacked on the upper portion of the semiconductor substrate 22.

On the surface of the semiconductor substrate 22 having the contact hole 30, an interlayer-insulating film 28, a conductive material layer 32 of a predetermined thickness and a photoresist pattern 34 for bitline mask are sequentially stacked as shown in FIG. 3B. Using the photoresist pattern 34, a portion of the contact hole 30 and the conductive material layer 32 coated on a predetermined portion of the interlayer-insulating film 28 are exposed.

FIG. 3C illustrates a bitline pattern 32A formed on the lower surface and one sidewall of the contact hole 30, and a damaged portion 36 of the impurity diffusion layer 26. The bitline pattern 32A is formed by etching the conductive material layer 32 which has been exposed, using the photoresist pattern 34. The photoresist pattern 34 is eliminated after performing the etching process. The damaged portion 36 of the impurity diffusion layer 26 is produced because a portion of the impurity diffusion layer 26 is removed altogether during etching of the conductive material layer 32. As described with reference to FIGS. 3A to 3C, the method for forming the contact of the conventional semiconductor device damages the lower conductive line pattern such as the impurity diffusion layer 26 due to over-etching during formation of the bitline pattern.

Figure 4A:
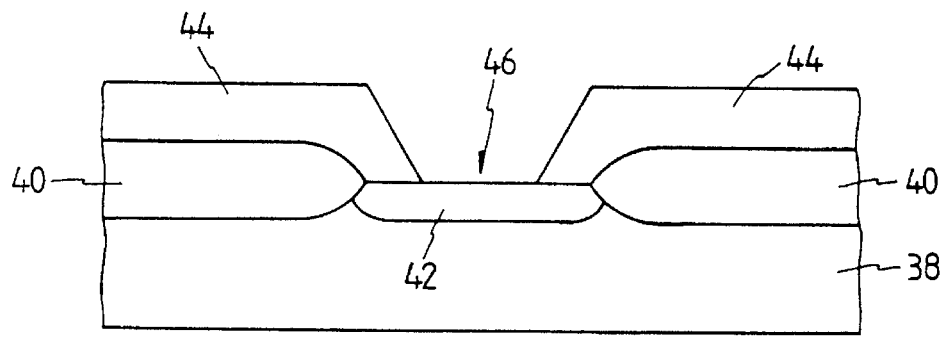
FIGS. 4A to 4C are sectional views showing a first embodiment of a process for forming the contact of the semiconductor device according to the present invention.
Figure 4B:
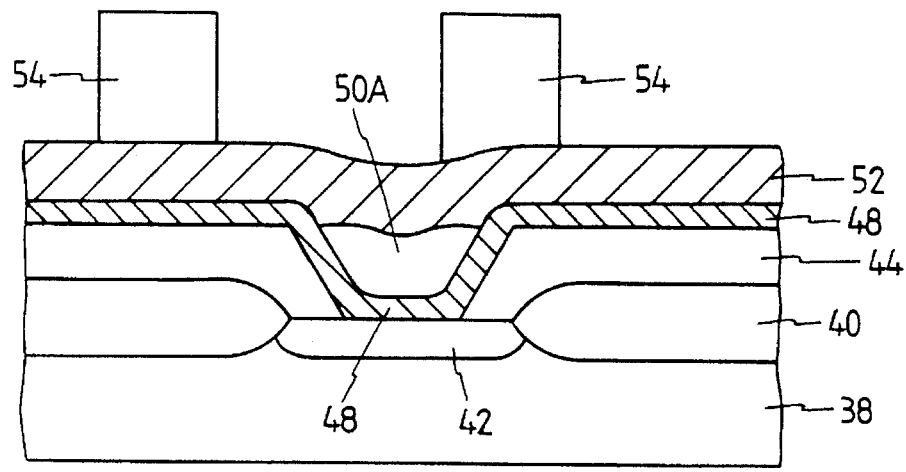
Figure 4C:
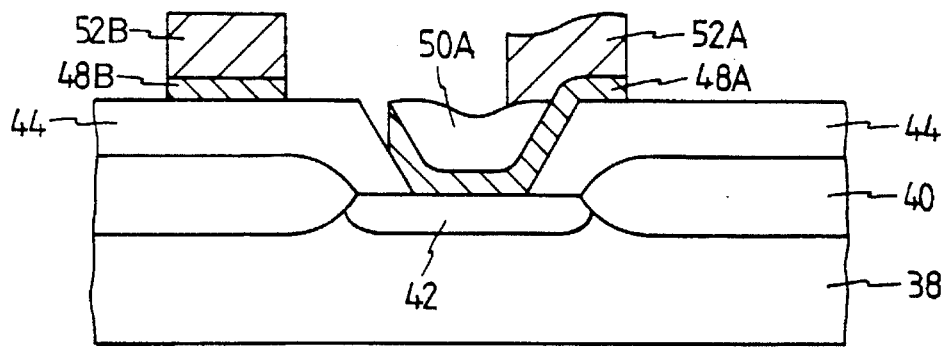

FIGS. 4A to 4C illustrate one embodiment of a process for forming the contact of the semiconductor device according to the present invention, wherein the contact 18 is formed to partially overlap the bitline pattern 16 as shown in FIG. 2. FIGS. 4A to 4C are sectional views of the semiconductor device according to the present invention, taken along the line a—a' of FIG. 2.

Referring to FIG. 4A, the semiconductor device has an isolation layer 40 formed on the upper portion of a semiconductor substrate 38 for separating regions on which respective elements will be formed, and an impurity diffusion layer 42 formed on the region having its corresponding element thereon separated by the isolation layer 40. The impurity diffusion layer 42 functions as an electrode pattern like a source or drain region, which will be electrically connected to the bitline pattern 16 shown in FIG. 2. An interlayer-insulating film 44 having a contact hole 46 formed therein is stacked on the upper portion of the semiconductor substrate 38 having the isolation layer 40 and impurity diffusion layer 42. The contact hole 46 is formed by isotropic etching of the interlayer-insulating material provided on the upper portion of the impurity diffusion layer 42 in the interlayer-insulating film 44 stacked on the upper portion of the semiconductor substrate 38. The opening of the contact hole 46 has a relatively larger area than the lower surface thereof, and an acute angle formed by the sidewall of the contact hole 46 is smaller than 90°.

As shown in FIG. 4B, the semiconductor device further includes a first conductive material layer 48 of a predetermined thickness coated over the lower surface and sidewall of the contact hole 46 and on the surface of the interlayer-insulating film 44, and a barrier material pattern 50A filling up a recess in the first conductive material layer 48. The upper end of the barrier material pattern 50A overlaps the lower end of the sidewall of the contact hole 46. The barrier material pattern 50A is formed by etching-back a barrier material layer stacked higher than the surface of the first conductive material layer 48 until the surface of the conductive material layer 48 is exposed. The first conductive material layer 48 is formed to be thin enough when compared with the size of the contact hole 46. A second conductive material layer 52 and a photoresist pattern 54 for bitline mask 54 are sequentially formed on the surface of the barrier material pattern 50A and the exposed first conductive material layer 48. The photoresist pattern 54 is arranged to expose a portion of the barrier material pattern 50A by an etching process. The barrier material pattern 50A is formed of an oxide layer material or nitride layer material which has an etch selectivity greater than those of the first and second conductive material layers 48 and 52.

FIG. 4C illustrates first and second bitline patterns 52A 52B formed on first and second pad conductive patterns 48A, 48B, respectively by etching-back the second conductive material layer 52 exposed by the photoresist pattern 54, and the first conductive material layer 48 disposed on the lower portion of the exposed second conductive material layer 52 until the surfaces of the barrier material pattern 50A and interlayer-insulating film 44 are exposed. The pad conductive pattern 48A on the lower portion of the barrier material pattern 50A is shielded by the barrier material pattern 50A from being etched. The impurity diffusion layer 42 is also shielded by the barrier material pattern 50A and interlayer-insulating film 44 from being damaged. In addition, the second conductive material on the upper portion of the barrier material pattern 50A is etched to partially overlap the bitline pattern 52 with the pad conductive pattern 48A. The photoresist pattern 54 is eliminated after performing the etching process of the first and second conductive material layers 48 and 52.

Figure 5A:
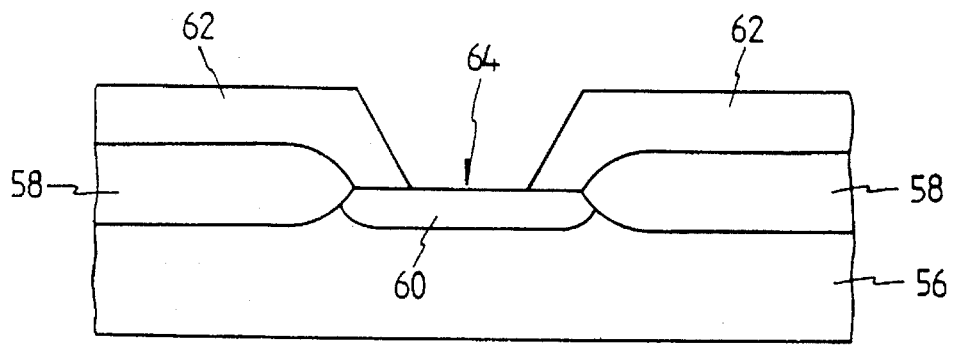
FIGS. 5A to 5C are sectional views showing a second embodiment of the process for forming the contact of the semiconductor device according to the present invention.
Figure 5B:
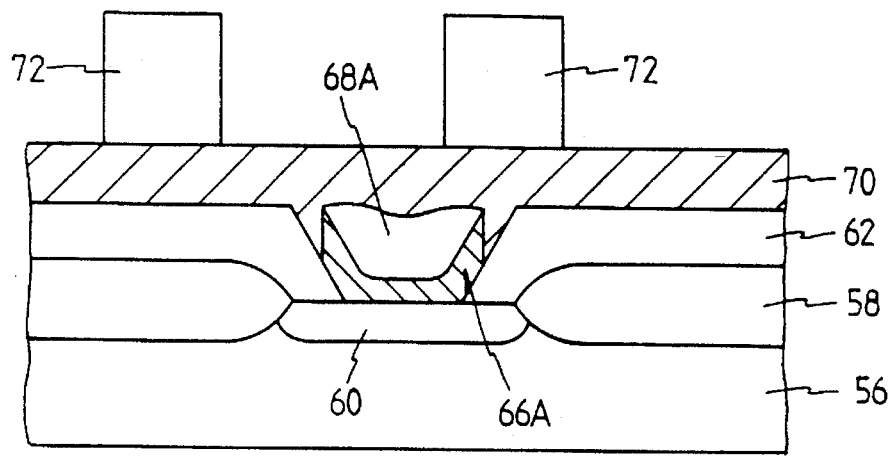
Figure 5C:
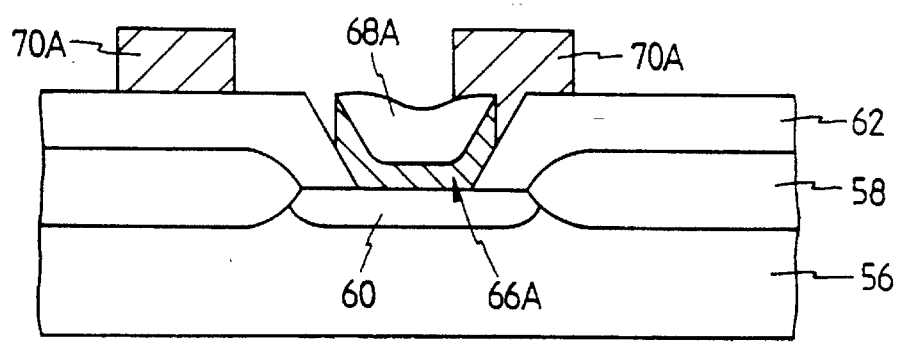

FIGS. 5A to 5C illustrate another embodiment of a process for forming the contact of the semiconductor device according to the present invention, wherein the contact 18 is formed to partially overlap the bitline pattern 16 shown in FIG. 2. FIGS. 5A to 5C are sectional views of the semiconductor device according to the present invention, taken along the line a—a' of FIG. 2.

Referring to FIG. 5A, the semiconductor device has an isolation layer 58 formed on the upper portion of a semiconductor substrate 56 for separating regions on which respective elements will be formed, and an impurity diffusion layer 60 formed on the region having its corresponding element thereon separated by the isolation layer 58. The impurity diffusion layer 60 functions as an electrode pattern like a source or drain region, which will be electrically connected to the bitline pattern 16 shown in FIG. 2. An interlayer-insulating film 62 having a contact hole 64 therein is stacked on the upper portion of the semiconductor substrate 56 having the isolation layer 58 and the impurity diffusion layer 60. The contact hole 64 is formed by isotropic etching of an interlayer-insulating material provided on the upper portion of the impurity diffusion layer 60 in the interlayer-insulating layer 62 stacked on the upper portion of the semiconductor substrate 56. The opening of the contact hole 64 has a relatively larger area than the lower surface thereof, and an acute angle formed by the sidewall of the contact hole 64 is smaller than 90°.

As shown in FIG. 5B, the semiconductor device further includes a pad electrode pattern 66A of a predetermined thickness coated over the lower surface and sidewall of the contact hole 64, and a barrier material pattern 68A filling up a recess in the pad electrode pattern 66A. The formation of the barrier material pattern 68A and pad electrode pattern 66A is carried out according to steps for coating a first conductive material layer 66 having a predetermined thickness on the lower surface and sidewall of the contact hole 64 and the surface of the interlayer-insulating film 62, and forming a barrier material layer 68 of a nitride or oxide layer material to the uppermost surface of the first conductive material layer 66. The barrier material pattern 68A is formed by etching the barrier material layer 68 until the surface of the first conductive material layer 66 is exposed. Moreover, the pad electrode pattern 66A is patterned by a process for etching the first conductive material layer 68 exposed by using the barrier material pattern 68A as a mask. The pad electrode pattern 66A is formed to be thin enough when compared with the size of the contact hole 64. A second conductive material layer 70 and a photoresist pattern for bitline mask 72 are sequentially formed on the surface of the barrier material pattern 68A and interlayer-insulating film 62. The photoresist pattern 72 is arranged to expose a portion of the barrier material pattern 68A during etching of the second conductive material layer 70. An oxide layer material or nitride layer material constituting the barrier material pattern 68A has a greater etch selectivity than those of the pad electrode pattern 66A and second conductive material layer 70.

FIG. 5C illustrates a bitline pattern 70A formed by etching the second conductive material layer 70 exposed by using the photoresist pattern 72. The pad electrode pattern 66A is shielded by the barrier material pattern 68A from being etched during the etching process of the second conductive material layer 70. The impurity diffusion layer 60 is also shielded by the barrier material pattern 68A and interlayer-insulating film 62 from being damaged during etching of the second conductive material layer 70. In addition, the second conductive material layer 70 on the upper portion of the barrier material pattern 68A is etched to partially overlap the bitline pattern 70A with the pad electrode pattern 66A. The photoresist pattern 72 is eliminated after performing the etching process of the second conductive material layer 70.

According to the present invention as described above, a contact hole formed in an interlayer-insulating film is covered by a pad conductive pattern electrically connected to a lower conductive line pattern, and then a barrier material is stacked on the upper portion of the pad conductive pattern to allow an upper conductive line pattern to partially overlap the pad conductive pattern. Also, by the barrier material pattern, the lower conductive line pattern is protected from being damaged during formation of the upper conductive line pattern. Moreover, the upper conductive line pattern partially overlaps the contact, thereby minimizing the unit area of the elements, and improving the packing density of the semiconductor device.

While the present invention has been particularly shown and described with reference to particular embodiments of a contact for connecting an impurity diffusion region with a bitline pattern, it will be understood by those skilled in the art that various changes in form and details may be effected without departing from the spirit and scope of the invention by forming the contact for electrically connecting the conductive lines provided on both surfaces of an insulating layer. Therefore, the spirit and scope of the present invention will be defined by the appended claims.

What is claimed is:

1. A contact of a semiconductor device comprising:

a semiconductor substrate having isolation layers formed thereon;

a first conductive line pattern formed on said semiconductor substrate between said isolation layers;

an interlayer-insulating film stacked on the surface of said semiconductor substrate and said isolation layers, said interlayer-insulation film having a contact hole formed therein for exposing said first conductive line pattern;

first and second conductive pads, said first conductive pad being formed on a sidewall and bottom of said contact hole and on a portion of said interlayer-insulating film adjacent to said contact hole, and said second conductive pad being formed on a portion of said interlayer-insulating film that is isolated by a distance from said contact hole;

a barrier material pattern formed on an upper portion of said first conductive pad, wherein a portion of said first conductive pad is exposed; and second and third conductive line patterns, said second conductive line pattern being formed on the exposed first conductive pad and a portion of said barrier material pattern, and said third conductive line pattern being formed on said second conductive pad.

2. A contact of a semiconductor device as claimed in claim 1, wherein said first conductive pad has a recess, and said barrier material pattern is disposed on said recess of said first conductive pad.

3. A contact of a semiconductor device as claimed in claim 2, wherein said contact hole has a sidewall inclined to allow the upper end of said barrier material pattern to overlap the lower end of said interlayer-insulating film.

4. A contact of a semiconductor device as claimed in claim 3, wherein said sidewall of said contact hole forms an acute angle smaller than 90°.

5. A contact of a semiconductor device as claimed in claim 1, wherein said barrier material pattern is formed of a material having an etch selectivity greater than those of said second and third conductive line patterns and said first and second conductive pads.

6. A contact of a semiconductor device as claimed in claim 5, wherein said barrier material pattern is formed of a nitride layer.

7. A contact of a semiconductor device as claimed in claim 5, wherein said barrier material pattern is formed of an oxide layer.

8. A contact of a semiconductor device comprising:

a semiconductor substrate having isolation layers formed thereon;

an impurity diffusion layer formed in said semiconductor substrate between said isolation layers;

an interlayer-insulating film formed on the surface of said semiconductor substrate and said isolation layers, said interlayer-insulating film having a contact hole formed therein for exposing said impurity diffusion layer;

first and second conductive pads, said first conductive pad being formed on a side wall and bottom of said contact hole and on a portion of said interlayer-insulating film adjacent to said contact hole, and said second conductive pad being formed on a portion of said interlayer-insulating film that is isolated by a distance from said contact hole;

a barrier material pattern formed on said first conductive pad overlapping said contact hole, said barrier material pattern being in contact with said first conductive pad so that a portion of said first conductive pad is exposed; and first and second bitline patterns, said first bitline pattern being formed on the exposed first conductive pad and a portion of said barrier material pattern, and said second bitline pattern being formed on said second conductive pad.

9. A contact of a semiconductor device as claimed in claim 8, wherein said contact hole has a sidewall inclined to allow the upper end of said barrier material pattern to overlap the lower end of said interlayer-insulating film.

10. A contact of a semiconductor device as claimed in claim 9, wherein said sidewall of said contact hole forms an acute angle smaller than 90°.

11. A contact of a semiconductor device as claimed in claim 8, wherein said barrier material pattern is formed of a material having an etch selectivity greater than those of said first and second bitline patterns and said first and second conductive pads.

12. A contact of a semiconductor device as claimed in claim 8, wherein said first bitline pattern is formed so that it partially overlaps said contact hole.

13. A contact of a semiconductor device as claimed in claim 8, wherein the width of said first bitline pattern is narrower than the width of said impurity diffusion layer, so that a unit area of circuit elements included in the semiconductor device can be minimized.

* * * * *